United States Patent
Fabreguette et al.

(10) Patent No.: US 10,964,536 B2
(45) Date of Patent: Mar. 30, 2021

(54) FORMATION OF AN ATOMIC LAYER OF GERMANIUM IN AN OPENING OF A SUBSTRATE MATERIAL HAVING A HIGH ASPECT RATIO

(71) Applicant: Micron Technology, Inc., Boise, ID (US)

(72) Inventors: Francois H. Fabreguette, Boise, ID (US); Paul A. Paduano, Boise, ID (US); Gurtej S. Sandhu, Boise, ID (US); John A. Smythe, III, Boise, ID (US); Matthew N. Rocklein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/269,201

(22) Filed: Feb. 6, 2019

(65) Prior Publication Data
US 2020/0251334 A1  Aug. 6, 2020

(51) Int. Cl.
 *H01L 21/02* (2006.01)
 *H01L 27/108* (2006.01)
(52) U.S. Cl.
 CPC .... *H01L 21/02532* (2013.01); *H01L 21/0259* (2013.01); *H01L 21/0262* (2013.01); *H01L 27/108* (2013.01)

(58) Field of Classification Search
None
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 2009/0112009 A1* | 4/2009 | Chen | H01L 45/06 556/12 |
| 2010/0124609 A1* | 5/2010 | Quick | C23C 16/45534 427/255.28 |
| 2010/0255653 A1* | 10/2010 | Marsh | H01L 45/06 438/384 |
| 2017/0117142 A1* | 4/2017 | Lee | H01L 21/02205 |
| 2017/0317194 A1* | 11/2017 | Tang | H01L 21/0228 |
| 2018/0358228 A1* | 12/2018 | Kim | H01L 21/324 |

* cited by examiner

*Primary Examiner* — Bilkis Jahan
(74) *Attorney, Agent, or Firm* — Brooks, Cameron & Huebsch, PLLC (57) ABSTRACT

Methods, apparatuses, and systems related to formation of an atomic layer of germanium (Ge) on a substrate material are described. An example method includes introducing, into a semiconductor processing chamber housing a substrate material having a high aspect ratio, a reducing agent, and introducing, into the semiconductor processing chamber, a germanium amidinate precursor. The example method further includes forming an atomic layer of germanium on the substrate material resulting from a reaction of the reducing agent and the germanium amidinate precursor.

20 Claims, 4 Drawing Sheets

FORMATION OF AN ATOMIC LAYER OF GERMANIUM IN AN OPENING OF A SUBSTRATE MATERIAL HAVING A HIGH ASPECT RATIO

TECHNICAL FIELD

The present disclosure relates generally to semiconductor devices and methods, and more particularly to formation of an atomic layer of germanium (Ge) on a substrate material.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Various types of memory devices, including volatile and/or non-volatile memory cells, can include openings in a substrate material. That is, the depth of an opening can be many times greater than a width or diameter of the opening. Such openings in a substrate material can contain, or be associated with, various materials that can contribute to data access, storage, and/or processing, or to various support structures, on a memory device.

The present disclosure includes methods, apparatuses, and systems related to forming an atomic layer of Ge on a substrate material. An example of a method described herein includes introducing, into a semiconductor processing chamber housing a substrate material having a high aspect ratio, a reducing agent and a Ge amidinate precursor. The example method further includes forming an atomic layer of Ge on the substrate material resulting from a reaction of the reducing agent and the Ge amidinate precursor.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2.

Figure 1:
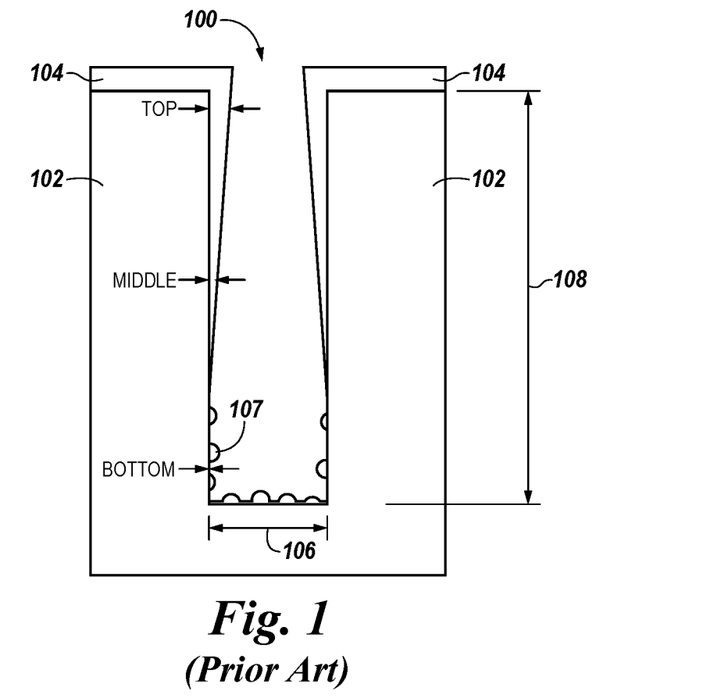
FIG. 1 illustrates a previous approach to forming a layer of material in an opening in a substrate material having a high aspect ratio.

FIG. 1 illustrates a previous approach to forming a layer of material 104 in an opening 100 in a substrate material 102 having a high aspect ratio. Some previous approaches to forming a layer of material, such as silicon germanium (SiGe), in an opening in a substrate material having a high aspect ratio use chemical vapor deposition (CVD). A CVD may be performing using Germane, Silane, and/or Disilane. Some previous approaches may use a layer of Si as a seed layer for subsequent layers of material, which may be formed by CVD. However, such previous approaches may not form a conformal layer of material in the opening, a continuous layer of material through the opening, and/or a layer of material having a uniform thickness through the opening. Such discontinuities and/or inconsistencies in a layer of material may cause layers of material and/or components subsequently formed over or in contact with the layer of material to also have discontinuities and/or inconsistencies.

As used herein, "uniformity" of a layer of material refers to the consistency of the thickness of the layer throughout the layer. For example, the layer of material 104 has poor uniformity because the thickness of the layer of material 104 near and at the top of the opening 100 is larger than the thickness of the layer of material 104 near and at the bottom of the opening 100. A layer of material 104 would have good uniformity if the thickness of the layer of material 104 were consistent on the sidewalls and the bottom of the opening (e.g., a consistent thickness from top to bottom of the opening 100). The uniformity of a layer of material can be a ratio of the difference between the maximum and minimum thicknesses of the layer and the average thickness of the layer and can be expressed as a percentage.

As used herein, "conformality" of a layer of material refers to the consistency of the thickness of the layer formed over high aspect ratio structures and/or transitions in the shape of a substrate material. That is, conformality describes the uniformity of a layer of material formed over high aspect ratio structures and/or transitions in the shape of a substrate material. As used herein, an opening having a "high aspect ratio" refers to an opening where the depth of the opening is at least twenty-five times greater than a width or diameter of the opening (e.g., an aspect ratio of at least 25:1).

As illustrated in FIG. 1, in some previous approaches a layer of material 104 may have a greater thickness at or near the top of the opening 100 than at the middle and/or the bottom of the opening 100. Additionally, the layer of material 104 may be discontinuous at or near the bottom of the opening. This is, in part, due to poor nucleation of the CVD material at or near the bottom of the opening 100. As used herein, "nucleation" refers to a process by which deposition of a material (e.g., a primary material) on another (e.g., secondary) material is initiated. For example, good nucleation can refer a high density of active sites on the secondary material that enables the primary material to grow on the secondary material and form a continuous layer. In contrast, poor nucleation can refer to a low density of active sites such that the primary material grows in discrete nodules (e.g., the nodule 107) as illustrated in FIG. 1 and form a rough layer (e.g., a layer having varying thicknesses) at a slow rate.

Because the opening 100 has a high aspect ratio (e.g., the width 106 of the opening 100 is much smaller than the depth 108 of the opening 100), it may be difficult to have the CVD material completely diffuse (e.g., penetrate) the depth 108 of the opening 100. The depth 108 is at least twenty-five times larger than the width 106.

CVD may deposit a material in an uncontrolled manner such that the layer of material 104 is thick and discontinuous. Because the CVD material may not fully diffuse in the opening 100, the CVD material may nucleate at the top and/or middle of the opening 100 before nucleating near or at the bottom of the opening 100. Thus, deposition of CVD material at the top and/or middle of the opening 100 may further inhibit diffusion of the CVD material near or at the bottom of the opening 100, result in the formation of nodules of the CVD material near or at the bottom of the opening 100.

Figure 2:
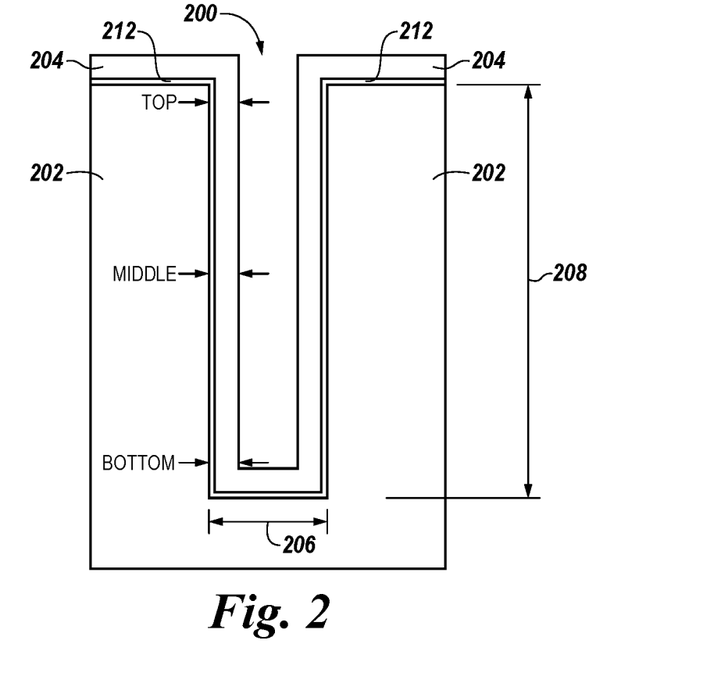
FIG. 2 illustrates forming a layer of material in an opening in a substrate material having a high aspect ratio in accordance with a number of embodiments of the present disclosure.

FIG. 2 illustrates forming a layer of material 204 in an opening 200 in a substrate material 202 having a high aspect ratio in accordance with a number of embodiments of the present disclosure. The substrate material 202 and the opening 200 can be analogous to the substrate material 102 and the opening 100 illustrated in FIG. 1. The depth 208 of the opening 200 is at least twenty-five times larger than the width 206 of the opening 200. Non-limiting examples of the opening 200 include a trench formed in the substrate material and an opening punched through the substrate material 202. For example, the width 206 can be a diameter of the opening 200 punched through the substrate material 202 having a circular cross section. The opening 200 may be formed in the substrate material 202 by an etching operation, for example, such as a wet or dry etching.

In contrast to previous approaches, such as that illustrated in FIG. 1, an atomic layer of Ge 212 can be formed in the opening 200 prior to forming the layer of material 204. To form the atomic layer of Ge, a reducing agent, such as ammonia ($NH_3$), can be introduced into a semiconductor processing chamber (e.g., a reacting chamber or the processing apparatus 762 described in association with FIG. 7, below) housing the substrate material 202. Subsequently, a Ge amidinate precursor, such as germanium butylamidinate (GeBAMDN), can be introduced to the semiconductor processing chamber. The reducing agent and the Ge amidinate precursor can react to perform an atomic layer deposition (ALD) of Ge. For example, an initial exposure of the Ge amidinate precursor to the reducing agent and the substrate material 202 can cause a monolayer of Ge to be formed over (e.g., absorbed by) the substrate material 202.

The conditions within the semiconductor processing chamber, such as the temperature and/or the pressure, can be varied to control the ALD of Ge. Varying temperature and/or pressure within the semiconductor processing chamber can vary growth rate of Ge. In ALD, it can be beneficial to heat a semiconductor processing chamber to a temperature within a temperature window where the growth rate of the ALD material (e.g., GE) is nearly constant. The amount of the reducing agent and/or the Ge amidinate precursor can be varied to control the ALD of Ge. Increasing the amount of time (e.g., dosage time) that the substrate material 202 is exposed to the reducing agent and/or Ge amidinate precursor enables the reducing agent and/or Ge amidinate precursor to fully diffuse in the opening 200. As a result, the atomic layer of Ge 212 can be continuous, conformal, and/or uniform. Although not illustrated in FIG. 2, in at least one embodiment, the atomic layer of Ge 212 can be conformal and/or uniform but not necessarily continuous.

Another monolayer of Ge can be formed over the previous monolayer of Ge to thicken the atomic layer of Ge 212. The semiconductor processing chamber can be purged to remove (e.g., flush) excess Ge amidinate precursor from the semiconductor processing chamber that was not absorbed by the substrate material 202. For example, all the reacting sites (e.g., surfaces) on the substrate material 202 may be saturated with the Ge amidinate precursor such that there is a remaining portion of previously introduced Ge amidinate precursor in the semiconductor processing chamber. Subsequent to purging the semiconductor processing chamber, the reducing agent can be reintroduced into the semiconductor processing chamber. The reducing agent reacts with the Ge amidinate precursor ligands on the substrate material 202 and enables regeneration of the reacting sites, preparing the reacting sites for another exposure to the Ge amidinate precursor. Subsequently, the Ge amidinate precursor can be reintroduced into the semiconductor processing chamber to deposit more Ge on previously deposited Ge.

Introducing the reducing agent and the Ge amidinate precursor in a cyclic manner as described above can form additional monolayers of Ge, one monolayer formed over another, to form the atomic layer of Ge 212. In an embodiment, each cycle can form 0.3 angstroms (Å) of the atomic layer of Ge 212. Purging the semiconductor processing chamber between each cycle (e.g., after dose of the Ge amidinate precursor) can avoid a gas phase reaction from occurring in the semiconductor processing chamber. An overall thickness of the atomic layer of Ge 212 including a plurality of monolayers of Ge formed in a plurality of cycles can be in the range of ten Å to thirty Å, inclusive. However, the overall thickness of the atomic layer of Ge is not so limited. For example, the overall thickness can be less than ten Å or greater than thirty Å. In at least one embodiment, as described in association with FIG. 3 below, a Si precursor can be introduced into the semiconductor processing chamber to dope the atomic layer of Ge 212 with Si.

As illustrated in FIG. 2, despite the high aspect ratio of the opening 200, the atomic layer of Ge 212 is conformal (e.g., has improved conformality as compared to the layer of material 104). The atomic layer of Ge 212 follows the contours of the opening 200. The atomic layer of Ge 212 is formed around the edge at the top of the opening and conforms to the shape of the edge. Thus, the atomic layer of Ge 212 has excellent conformality. For example, the atomic layer of Ge 212 has a consistent thickness from the top of the substrate material 202 to the sidewalls of the opening 200 and from the sidewalls of the opening 200 to the bottom of the opening 200.

As illustrated in FIG. 2, despite the high aspect ratio of the opening 200, the atomic layer of Ge 212 is uniform throughout the opening 200. The thickness of the atomic layer of Ge 212 is consistent from the top of the opening 200 to the bottom of the opening 200.

The formation (e.g., ALD) of the atomic layer of Ge 212 can be a purely thermal process. The ALD of Ge to form the atomic layer of Ge 212 can be a self-limiting process. In a non-self-limiting process, for example, the Ge amidinate precursor may continue to decompose and deposit Ge on a substrate material even if all the active sites have had Ge deposited thereon. In contrast, the ALD of Ge as described herein is self-limiting because there is a thermal window in which the Ge amidinate precursor will decompose (e.g., approximately 225° C. to 250° C.) and the Ge will only be deposited on active sites. Thus, the ALD of Ge does not run away. The reaction of the reducing agent and the Ge amidinate precursor can be self-limiting half reactions. The mass gain and/or the thickness of the atomic layer of Ge 212 resulting from the reaction of the reducing agent (e.g., ammonia) and the Ge amidinate precursor (e.g., GeBAMDN) can be linear with respect to the number of cycles of the reaction. For example, as described above, each cycle can deposit an amount of Ge such that the thickness of the atomic layer of Ge increases at a linear rate (e.g., 0.3 Å of Ge per cycle).

As illustrated in FIG. 2, the atomic layer of Ge 212 can be a seed layer for forming a layer of material 204 in contact with the atomic layer of Ge. As described in association with FIG. 1, there may be poor nucleation of a CVD material in the opening 100. For example, if the substrate material is an oxide material, CVD Ge may exhibit poor nucleation, which may lead to a non-continuous layer of Ge as illustrated in FIG. 1. The atomic layer of Ge 212 improves nucleation of CVD materials, such as CVD Ge. Consequently, the layer of material 204 can be continuous throughout the opening 200. Although not illustrated in FIG. 2, in at least one embodiment, the layer of material 204 can be conformal and/or uniform but not necessarily continuous.

As illustrated in FIG. 2, the conformality of the atomic layer of Ge 212 improves the conformality of the layer material 204 as compared to the layer of material 104, despite the high aspect ratio of the opening 200. The layer of material 204 follows the contours of the opening 200. The layer of material 204 is formed around the edge at the top of the opening and conforms to the shape of the edge. At the bottom of the opening 200, the layer of material 204 transitions from being in contact with a sidewall of the opening 200 to the bottom of the opening 200 continuously. A layer of material (not shown) formed in contact with or on (e.g., not in direct contact with) the layer of material 204 can also have improved conformality. The layer of material 204 has a consistent thickness from the top of the substrate material 202 to the sidewalls of the opening 200 and from the sidewalls of the opening 200 to the bottom of the opening 200.

As illustrated in FIG. 2, the uniformity of the atomic layer of Ge 212 improves the uniformity of the layer of material 204 as compared to the layer of material 104, despite the high aspect ratio of the opening 200. The thickness of the layer of material 204 is consistent from the top of the opening 200 to the bottom of the opening 200. Comparing FIG. 2 to FIG. 1, the quantity of nodules is reduced. A layer of material (not shown) formed in contact with or on (e.g., not in direct contact with) the layer of material 204 can also have improved uniformity.

The layer of material 204 can be formed in contact with the atomic layer of Ge 212 via CVD. The CVD can be performed in a different semiconductor processing chamber (e.g., a CVD chamber) than the semiconductor processing chamber in which the atomic layer of Ge 212 is formed. However, no additional processing, steps, or procedures may need to be performed between the formation of the atomic layer of Ge 212 and the formation of the layer of material 204. That is, the layer of material 204 can be formed directly subsequent to the formation of the atomic layer of Ge 212. Using the atomic layer of Ge 212 can reduce, or even eliminate, pinch-off.

In at least one embodiment, the layer of material 204 can comprise Ge. In at least one embodiment, the layer of material 204 can comprise a silicon material, such as Si or SiGe. In an embodiment, the substrate material can be a metal nitride, such as titanium nitride (TiN). The atomic layer of Ge 212 can serve as a boron diffusion barrier from the silicon material to the substrate material (e.g., TiN). As a result, semiconductor devices including an atomic layer of Ge in accordance with the present disclosure can have improved electric performance as described in association with FIG. 3 below.

Although FIG. 2 shows the substrate material 202 as a single material, embodiments in accordance with the present disclosure are not so limited. For example, the substrate material 202 can include a plurality of materials formed in a plurality of planes.

Figure 3:
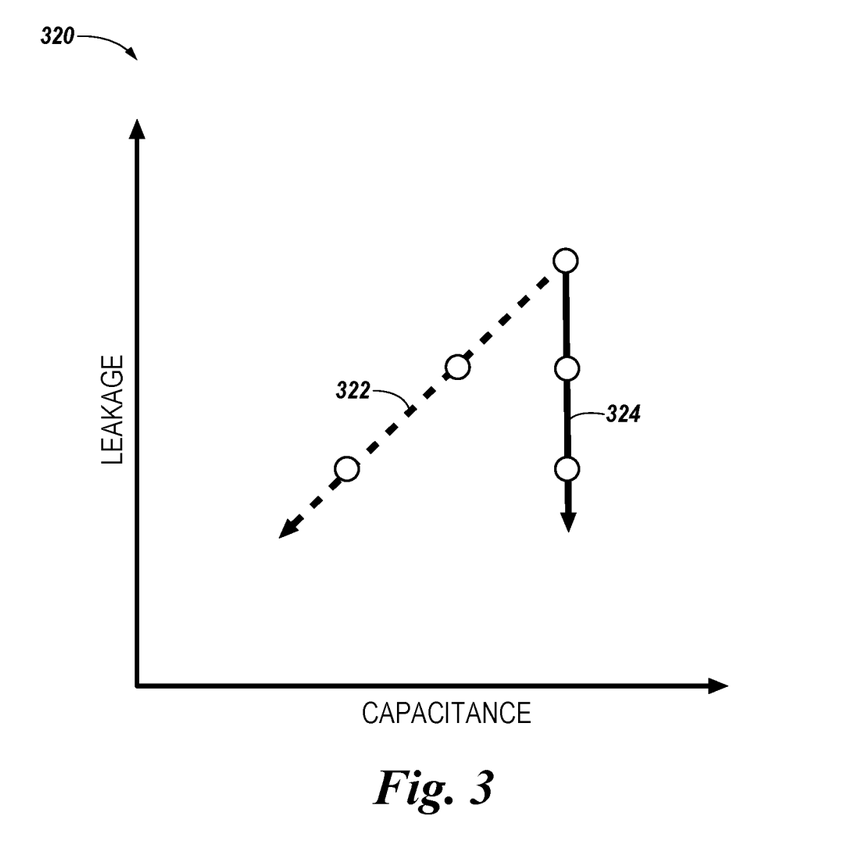
FIG. 3 is a graph illustrating improved electrical properties of a semiconductor device formed in accordance with a number of embodiments of the present disclosure.

FIG. 3 is a graph 320 illustrating improved electrical properties of a semiconductor device formed in accordance with a number of embodiments of the present disclosure. The line 322 corresponds to electrical properties of a semiconductor device formed according to some previous approaches. The line 324 corresponds to electrical properties of a semiconductor device formed in accordance with the present disclosure.

As illustrated by the line 322, in some previous approaches, reducing the leakage current may come at the cost of capacitance. That is, reducing the leakage current of a semiconductor device may reduce the capacitance of the semiconductor device. In contrast, as illustrated by the line 324, a semiconductor device formed in accordance with the present disclosure can have a reduced leakage voltage (e.g., high voltage leakage voltage) without reducing the capacitance of the semiconductor device. The uniformity of the atomic layer of Ge and subsequent layer(s) of material formed over the atomic layer of Ge help reduce the leakage voltage. A semiconductor device formed in accordance with the present disclosure can have increased benefit voltage without reducing the capacitance of the semiconductor device. That is, a higher voltage can be applied to the semiconductor device while passing at a lower electrical current through the semiconductor device.

Figure 4:
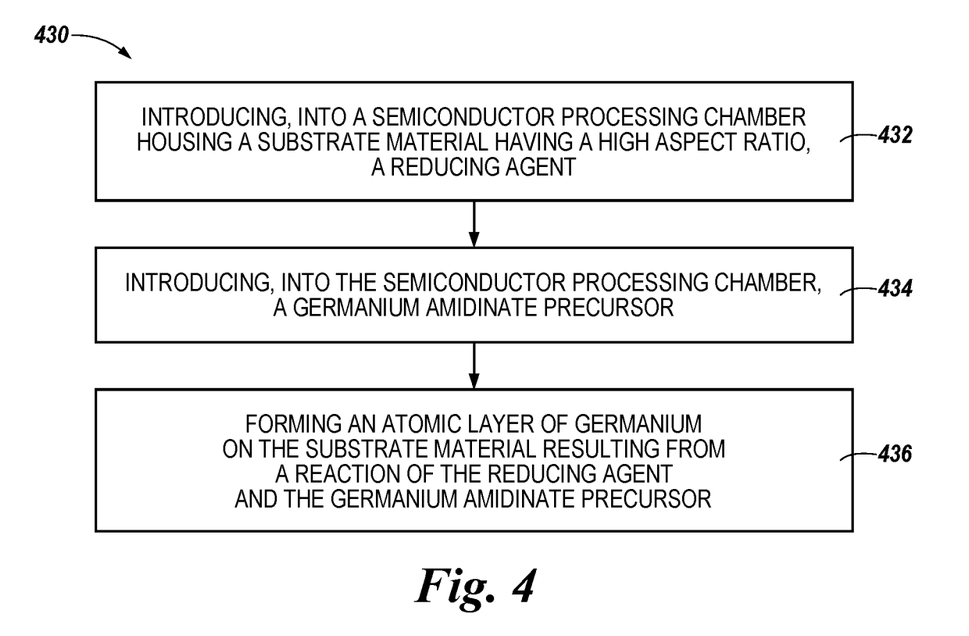
FIGS. 4-6 are flow diagrams of example methods for formation of an atomic layer of Ge in accordance with a number of embodiments of the present disclosure.

FIG. 4 is a flow diagram of an example method 430 for formation of an atomic layer of Ge in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 432, the method 430 can include introducing, into a semiconductor processing chamber housing a substrate material having a high aspect ratio, a reducing agent (e.g., as described in connection with FIG. 2). Introducing the reducing agent can include introducing ammonia into the semiconductor processing chamber.

At block 434, the method 430 can include introducing, into the semiconductor processing chamber, a Ge amidinate precursor (e.g., as described in connection with FIG. 2).

The method 430 can, in a number of embodiments, further include, subsequent to forming the atomic layer of Ge on the substrate material, purging the reacting chamber, introducing the reducing agent and the Ge amidinate precursor into the semiconductor processing chamber, and forming a different atomic layer of Ge on the atomic layer of Ge resulting from a reaction of the reducing agent and the Ge amidinate precursor (e.g., as described in connection with FIG. 2). Forming the atomic layer of Ge can include heating the semiconductor processing chamber to a temperature between approximately 150° C. and approximately 325° C., inclusive. The growth rate of Ge can be nearly constant in the temperature window between 150° C. and 325° C.

Forming the atomic layer of Ge can be a purely thermal process. That is, there is no other source of energy causing the reaction to occur than heat. Some previous approaches may include one or more additional energy sources, such as plasma energy enhancement, microwave energy enhancement, electron shower, photons, and phonons. As described herein, an atomic layer of Ge can be formed without additional sources of energy because the Ge amidinate precursor enables the reaction with the reducing agent to be a purely thermal process. An additional source of energy, such as ions, may be repulsive and further inhibit diffusion of the Ge amidinate precursor and/or the reducing agent throughout a high aspect ratio structure (e.g., the opening 200). Because embodiments in accordance with the present disclosure do not include additional sources of energy, the Ge amidinate precursor and the reducing agent can fully diffuse throughout a high aspect ratio structure, thereby enabling the atomic layer of Ge to be conformal and/or uniform.

The method 430 can, in a number of embodiments, further include, subsequent to forming the atomic layer of Ge on the substrate material, purging the semiconductor processing chamber, introducing a silicon precursor into the semiconductor processing chamber, and doping the atomic layer of Ge with silicon resulting from a reaction of the reducing agent and the silicon precursor. Examples of a silicon precursor can include silane, disilane, neopentasilane, R SiMe$_3$, R SiEt$_3$, R SiHEt$_2$, and R SiMe$_2$Ph where R represents a chemical group such as an alkyl group including one to six carbon atoms. The atomic layer of Ge (e.g., the atomic layer of Ge 212 illustrated in FIG. 2) be exposed to the silicon precursor directly subsequent to purging the semiconductor processing chamber (e.g., purging the reducing agent) to insert Si into the atomic layer of Ge.

A length of time of introducing the silicon precursor can be controlled to control an amount of Ge in the silicon-doped atomic layer of Ge. For example, the longer the atomic layer of Ge is exposed to the silicon precursor, the more Si can be inserted into the atomic layer of Ge. Thus, the amount of Ge in the silicon-doped atomic layer of Ge can be tunable from, for example, 100% (e.g., 0% Si) to 50% (e.g., 50% Si). Note that the doping of the atomic layer of Ge with Si is not performed via ALD or CVD. Therefore, the maximum Si insertion in the atomic layer of Ge can be one monolayer. Lengths of time of exposure of the atomic layer of Ge to the silicon precursor can be in the range of five to sixty seconds, inclusive (e.g., thirty seconds); however, embodiments are not so limited.

Doping the atomic layer of Ge to be 50% Si and 50% Ge can include one full cycle of Ge ALD as described herein followed by one full insertion of Si. As used herein, "full cycle" and "full insertion" refer to the insertion of Si into the formation of Ge to form SiGe. As described above, a surface upon which Ge has been formed (e.g., the atomic layer of Ge) can be exposed to a silicon-containing precursor. When the dose of the Si precursor is long enough, a full monolayer of Si can be formed between two layers of Ge. As a result, there can be a 1:1 ratio of Si to Ge (e.g., 50% Si and 50% Ge). Therefore, one full cycle refers to deposition of a complete monolayer of Si when the atomic layer of Ge is exposed to a Si precursor for a long enough length of time. The amount of Ge in the silicon-doped atomic layer of Ge can be consistent throughout the silicon-doped atomic layer. For example, referring back to FIG. 2, the amount of Ge in the silicon-doped atomic layer of Ge 212 can be approximately the same at the middle of the opening 100 and at the bottom of the opening 100.

For flat surfaces, the amount of time that the atomic layer of Ge (e.g., for each cycle of Ge ALD described herein) is exposed to the silicon precursor can be controlled to fine tune the amount of Ge in the silicon-doped atomic layer of Ge (e.g., a SiGe film) from, for example, 100% to 50%.

For structures having a high aspect ratio, such as trenches, the amount of time that the atomic layer of Ge (e.g., for each cycle of Ge ALD described herein) is exposed to the silicon precursor can be increased (as compared to that for flat surfaces) to enable the silicon precursor to diffuse (e.g., penetrate) all the way down a high aspect ratio structure. Thus, the insertion of Si into the atomic layer of Ge can be total such that the silicon-doped atomic layer of Ge will have 50% Ge. However, because the formation of the atomic layer of Ge can be true-ALD, the number of cycles of the Ge ALD can be increased to increase the amount of Ge in the silicon-doped atomic layer of Ge even though the Si insertion may be locked at one monolayer.

The method 430 can, in a number of embodiments, further include, directly subsequent to forming the atomic layer of Ge on the substrate material, forming a film of Ge on the atomic layer of Ge via CVD. The method 430 can, in a number of embodiments, further include, subsequent to forming the atomic layer of Ge on the substrate material, forming a nitride material on the atomic layer of Ge.

Figure 5:
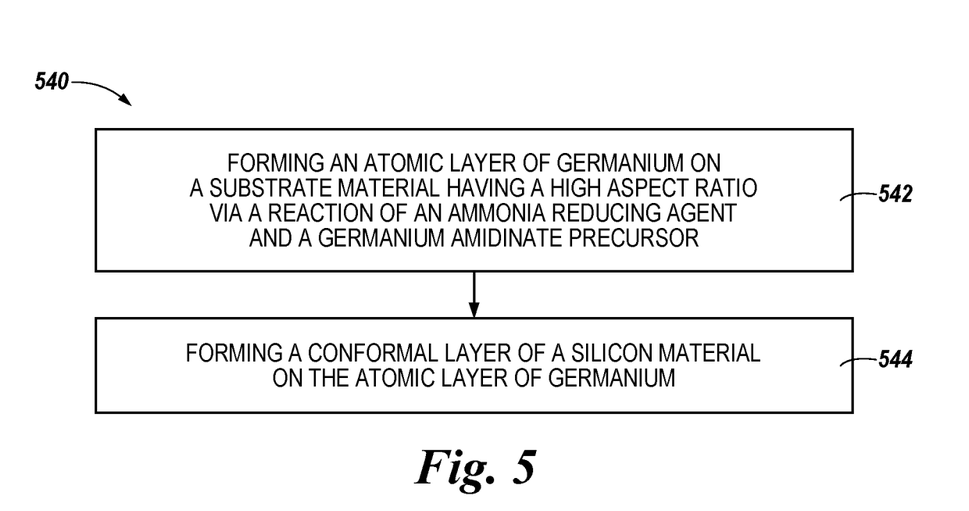

FIG. 5 is a flow diagram of an example method 540 for formation of an atomic layer of Ge in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 542, the method 540 can include forming an atomic layer of Ge on a substrate material having a high aspect ratio via a reaction of an ammonia reducing agent and a Ge amidinate precursor (e.g., as described in connection with FIG. 2). Forming the atomic layer of Ge can include ALD of Ge on the substrate material. In at least one embodiment, forming the atomic layer of Ge includes a plurality of cycles of depositing another atomic layer of Ge on a previous atomic layer of Ge. The plurality of cycles of depositing another atomic layer of Ge can form an approximately thirty-two angstroms thick layer of Ge on the substrate material. The plurality of cycles of depositing another atomic layer of Ge can include fifteen to forty-five cycles, each cycle depositing approximately 0.3 angstroms of Ge.

At block 544, the method 540 can include forming a conformal layer of a silicon material on the atomic layer of Ge (e.g., as described in connection with FIG. 2). Forming the conformal layer of the silicon material can include forming a conformal layer of a silicon germanium material. Forming the conformal layer of the silicon material can include forming a conformal layer of a silicon poly material.

Figure 6:
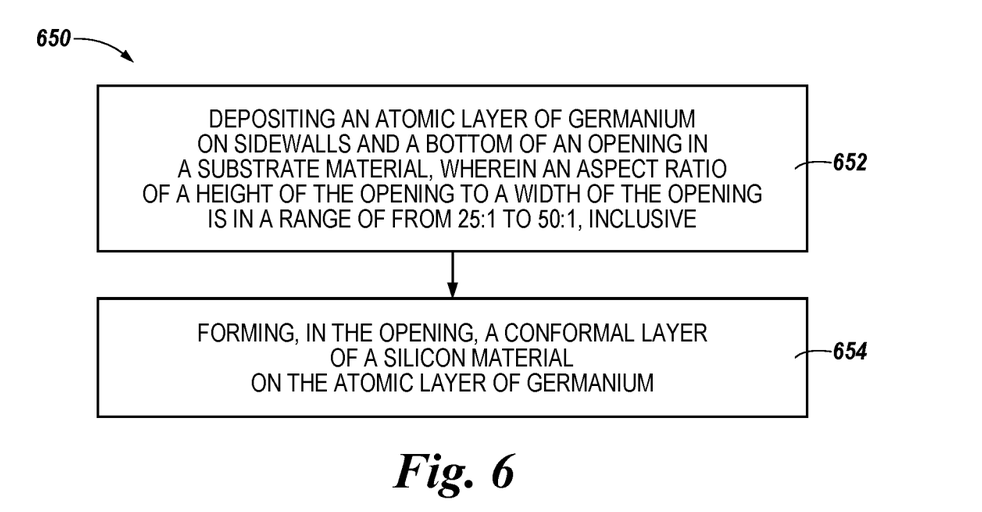

FIG. 6 is a flow diagram of an example method 650 for formation of an atomic layer of Ge in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 652, the method 650 can include depositing an atomic layer of Ge on sidewalls and a bottom of an opening in a substrate material. An aspect ratio of a height of the opening to a width of the opening can be in a range of from 25:1 to 3000:1, inclusive.

At block 654, the method 650 can include forming, in the opening, a conformal layer of a silicon material on the atomic layer of Ge. Forming the conformal layer of the silicon material can include forming the conformal layer of the silicon material having an approximately uniform thickness throughout the opening. Forming the conformal layer of the silicon material can include forming a continuous and conformal layer of the silicon material throughout the opening.

The method 650 can, in a number of embodiments, further include, forming, in the opening, a conductive material on the conformal layer of the silicon material.

A portion of a memory device can be formed in accordance with the present disclosure. For example, a portion of a memory device can be formed by the methods 430, 540, and/or 650 described in association with FIGS. 4-6 above. In at least one embodiment, the portion of the memory device can include at least one memory cell. Such a memory cell can include at least one capacitor, as a data storage element, including a conformal layer of a silicon material. The memory cell can include at least one access device (e.g., a transistor) coupled to the at least one capacitor.

Figure 7:
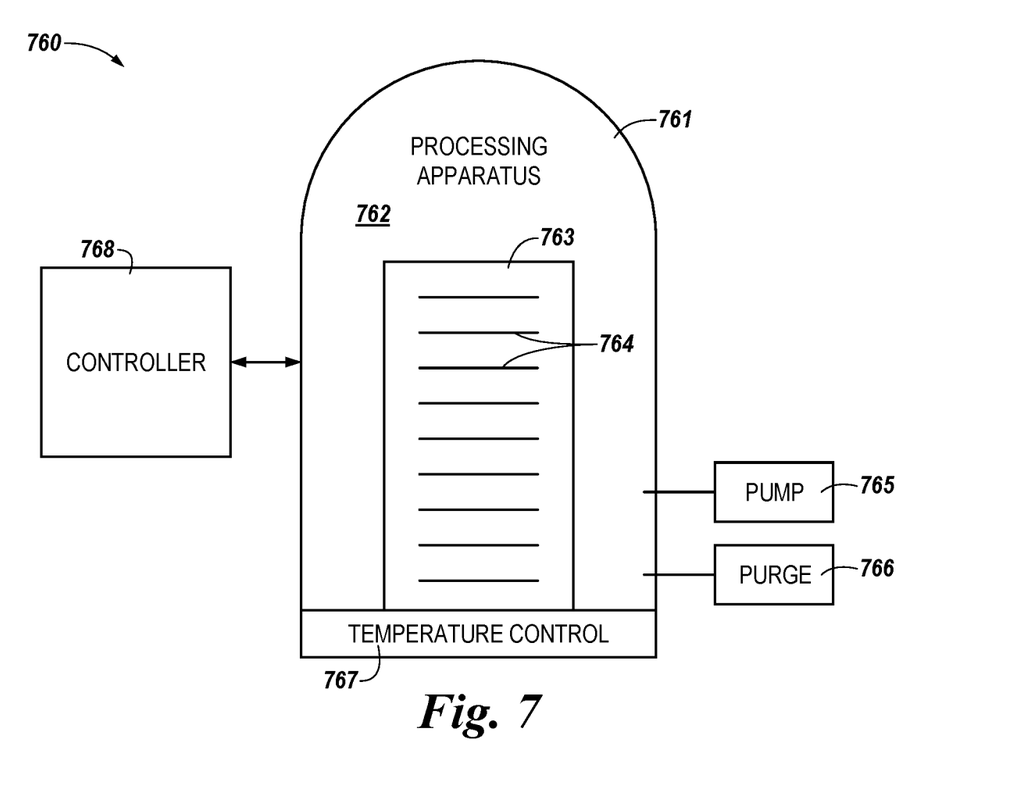
FIG. 7 is a functional block diagram of a system for implementation of an example semiconductor fabrication process in accordance with a number of embodiments of the present disclosure.

FIG. 7 is a functional block diagram of a system 760 for implementation of an example semiconductor fabrication process in accordance with a number of embodiments of the present disclosure. The system 760 can include a processing apparatus 761. The processing apparatus 761 can be configured to enable formation of an atomic layer of Ge.

The processing apparatus 761 can include a semiconductor processing chamber 762 to enclose components configured to form an atomic layer of Ge (e.g., the substrate material 202 described in association with FIG. 2 above on which the atomic layer of Ge is formed by the example methods 430, 540, and/or 650). The chamber 762 can further enclose a carrier 763 to hold a batch of semiconductor wafers 764 (e.g., the substrate material 202). The processing apparatus 761 can include and/or be associated with tools including, for example, a pump 765 unit and a purge 766 unit configured to introduce and remove Ge amidinate precursor and a reducing agent, as described herein. The processing apparatus 761 can further include a temperature control 767 unit configured to maintain the chamber 762 at an appropriate temperature as described herein (e.g., between approximately 150° C. and approximately 325° C.).

The system 760 can further include a controller 768. The controller 768 can include, or be associated with, circuitry and/or programming for implementation of, for instance, formation of an atomic layer of Ge. Adjustment of such deposition and purging operations by the controller 768 can control the thickness of the atomic layer of Ge and/or thicknesses of other materials formed over the atomic layer of Ge as described herein.

The controller 768 can, in a number of embodiments, be configured to use hardware as control circuitry. Such control circuitry may, for example, be an application specific integrated circuit (ASIC) with logic to control fabrication steps, via associated deposition and purge processes, for formation of an atomic layer of Ge and/or other materials formed over the atomic layer of Ge.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to formation of an atomic layer of Ge on a substrate material g, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to formation of an atomic layer of Ge on a substrate material than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   introducing, into a semiconductor processing chamber housing a substrate material including an opening having a high aspect ratio, a reducing agent;
   introducing, into the semiconductor processing chamber, a germanium amidinate precursor;
   forming, in the opening, an atomic layer of germanium on the substrate material resulting from a reaction of the reducing agent and the germanium amidinate precursor; and
   subsequent to forming the atomic layer of germanium:
      purging the semiconductor processing chamber;
      introducing, into the semiconductor processing chamber, a silicon precursor; and
      doping the atomic layer of germanium with silicon resulting from a reaction of the atomic layer of germanium and the silicon precursor.

2. The method of claim 1, further comprising, subsequent to forming the atomic layer of germanium on the substrate material:
   purging the semiconductor processing chamber;
   introducing, into the semiconductor processing chamber, the reducing agent;
   introducing, into the semiconductor processing chamber, the germanium amidinate precursor; and
   forming a different atomic layer of germanium on the atomic layer of germanium resulting from a reaction of the reducing agent and the germanium amidinate precursor.

3. The method of claim 1, wherein introducing the reducing agent comprises introducing ammonia into the semiconductor processing chamber.

4. The method of claim 1, further comprising, controlling a length of time of introducing the silicon precursor to control an amount of germanium in the silicon-doped atomic layer of germanium.

5. The method of claim 1, further comprising, directly subsequent to forming the atomic layer of germanium on the substrate material, forming a film of germanium on the atomic layer of germanium via chemical vapor deposition (CVD).

6. The method of claim 1, wherein forming the atomic layer of germanium includes heating the semiconductor processing chamber to a temperature between approximately 150° C. and approximately 325° C., inclusive.

7. The method of claim 1, wherein forming the atomic layer of germanium is a purely thermal process.

8. The method of claim 1, further comprising, subsequent to forming the atomic layer of germanium on the substrate material, forming a nitride material on the atomic layer of germanium.

9. A method, comprising:
   forming, in an opening of a substrate material having a high aspect ratio, an atomic layer of germanium via a reaction of an ammonia reducing agent and a germanium amidinate precursor;
   subsequent to forming the atomic layer of germanium:
      purging a semiconductor processing chamber;
      introducing, into the semiconductor processing chamber, a silicon precursor; and
      doping the atomic layer of germanium with silicon resulting from a reaction of the atomic layer of germanium and the silicon precursor; and
   forming a conformal layer of a silicon material on the atomic layer of germanium.

10. The method of claim 9, wherein forming the atomic layer of germanium includes atomic layer deposition (ALD) of germanium on the substrate material.

11. The method of claim 9, wherein forming the conformal layer of the silicon material includes forming a conformal layer of a silicon germanium material.

12. The method of claim 9, wherein forming the conformal layer of the silicon material includes forming a conformal layer of a silicon poly material.

13. The method of claim 9, wherein forming the atomic layer of germanium includes a plurality of cycles of depositing another atomic layer of germanium on a previous atomic layer of germanium.

14. The method of claim 13, wherein the plurality of cycles of depositing another atomic layer of germanium form an approximately thirty-two angstroms thick layer of germanium on the substrate material.

15. The method of claim 13, wherein the plurality of cycles of depositing another atomic layer of germanium include fifteen to forty-five cycles, each cycle depositing approximately 0.3 angstroms of germanium.

16. A method, comprising:
   depositing an atomic layer of germanium on sidewalls and a bottom of an opening in a substrate material, wherein an aspect ratio of a height of the opening to a width of the opening is in a range of from 25:1 to 300:1, inclusive;
   subsequent to depositing the atomic layer of germanium:
      purging a semiconductor processing chamber;
      introducing, into the semiconductor processing chamber, a silicon precursor; and
      doping the atomic layer of germanium with silicon resulting from a reaction of the atomic layer of germanium and the silicon precursor; and
   forming, in the opening, a conformal layer of a silicon material on the atomic layer of germanium.

17. The method of claim 16, wherein forming the conformal layer of the silicon material includes forming the conformal layer of the silicon material having an approximately uniform thickness throughout the opening.

18. The method of claim 16, wherein forming the conformal layer of the silicon material includes forming a continuous and conformal layer of the silicon material throughout the opening.

19. The method of claim 16, further comprising forming, in the opening, a conductive material on the conformal layer of the silicon material.

20. A portion of a memory device formed by the method of claim 16, wherein:
- the memory device comprises at least one memory cell that includes:
  - at least one capacitor, as a data storage element, including the conformal layer of the silicon material; and
  - at least one access device coupled to the at least one capacitor.

\* \* \* \* \*